United States Patent

Bromley et al.

[11] Patent Number: 5,887,046
[45] Date of Patent: Mar. 23, 1999

[54] METHOD, SYSTEM, AND DEVICE FOR ACCUMULATING DATA AND MAINTAINING THE ACCUMULATED DATA

[75] Inventors: Steven D. Bromley, Austin; Thomas J. Chase, Seguin; Scott T. Christians, Buda; Anna M. Worthy, Austin, all of Tex.

[73] Assignee: Motorola Inc., Schaumburg, Ill.

[21] Appl. No.: 975,030

[22] Filed: Nov. 20, 1997

[51] Int. Cl.⁶ .................................................. H03K 21/00
[52] U.S. Cl. .................................. 377/39; 377/26; 377/33
[58] Field of Search .............................. 365/236; 377/26, 377/33, 39

[56] References Cited

U.S. PATENT DOCUMENTS 5,581,778  12/1996  Chin et al. .............................. 395/800

*Primary Examiner*—Margaret R. Wambach
*Attorney, Agent, or Firm*—Nicholas C. Hopman

[57] ABSTRACT

A method of accumulating and maintaining the accumulated data comprises steps of maintaining an intermediate count in a first memory device (12), reading a plurality of count values from a second memory device (14), determining a greatest count value of a subset of the plurality of count values which satisfy at least one criterion, and determining an updated count based upon the intermediate count and the greatest count value. The at least one criterion includes a criterion that the greatest count value differs from a second greatest count value of the subset of the plurality of count values by at most a predetermined difference greater than one. A system and a device to perform the method are detailed.

30 Claims, 5 Drawing Sheets

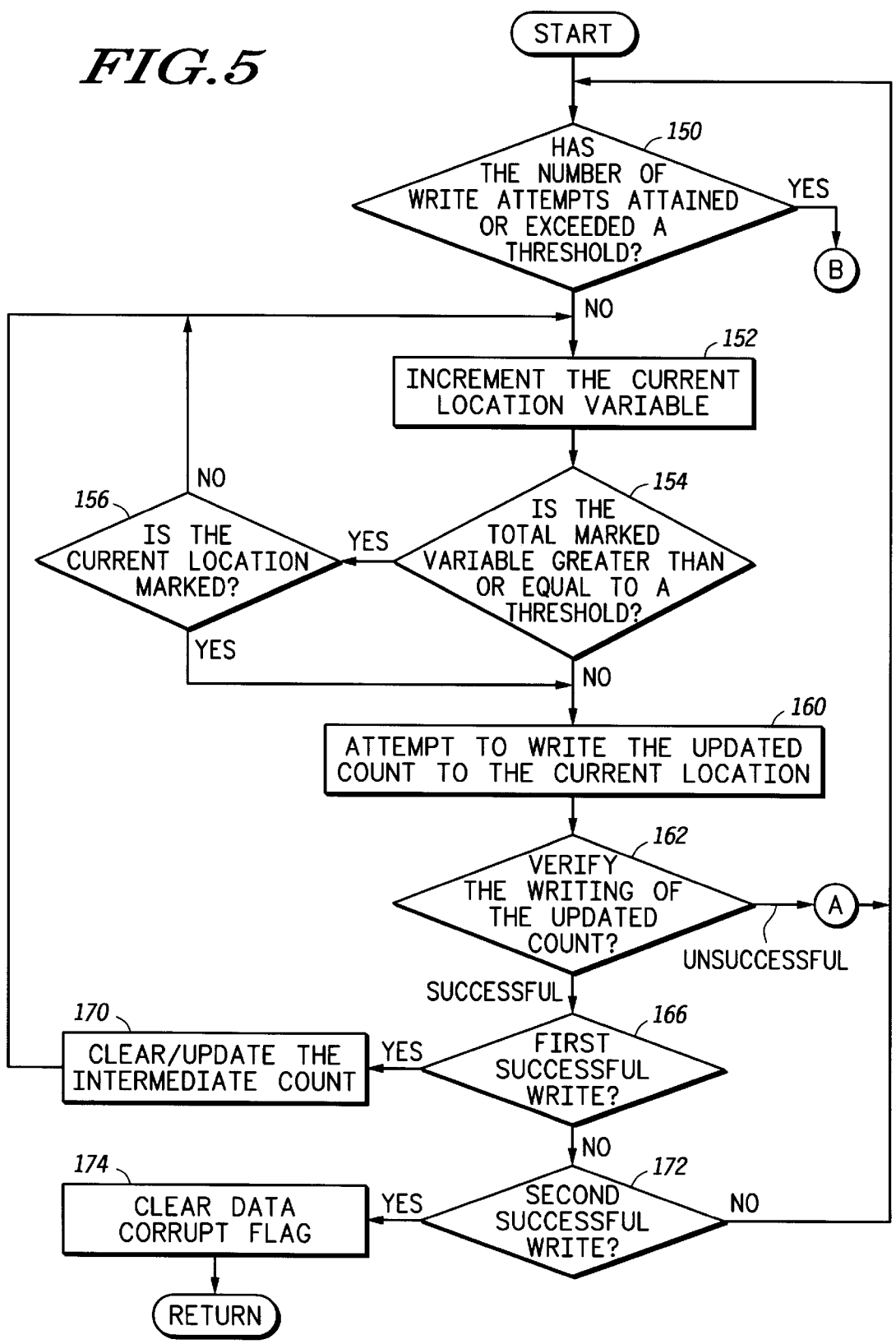

METHOD, SYSTEM, AND DEVICE FOR ACCUMULATING DATA AND MAINTAINING THE ACCUMULATED DATA

FIELD OF THE INVENTION

The present invention relates to methods, systems, and devices for accumulating data and maintaining the accumulated data such as counts using at least one memory device.

BACKGROUND OF THE INVENTION

In many applications, accumulated data such as up-counts or down-counts are to be maintained for a long time duration. In an example application, three million counts are to be incrementally stored in a serial EEPROM (electronically erasable programmable read only memory) over a ten year lifetime without exceeding a 0.05% inaccuracy tolerance in a harsh operating environment.

The process of accumulating data and maintaining the accumulated data can be corrupted in a number of ways. For example, a memory location in an EEPROM can experience a write-cycle based EEPROM failure because a threshold (commonly referred to as a wear-out specification) of supported write cycles thereto is attained or exceeded. The threshold is not fixed for any given EEPROM device but is a function of many factors such as process variation when the EEPROM device is initially fabricated, as well as its operating environment. As the threshold is approached, a fading failure can occur where data written to a memory location is initially readable, but fades over time to be corrupted or unreadable, thus the integrity of the data written can be lost completely. Once the threshold is exceeded, a hard failure can occur where data written to the memory location cannot be read immediately after being written. A wear-out specification for a memory location of a typical EEPROM at room temperature is about 1,000,000 write cycles. At higher temperatures, however, the wear-out specification degrades to about 100,000 write cycles.

An interface-based failure can occur when communication between a controller and the EEPROM device is corrupted. Communication can be corrupted, for example, when a serial interface coupling the controller and the EEPROM device is subjected to electromagnetic interference such as a radio frequency interference, noise, glitches, or other disturbances.

What is needed is an improved approach for accumulating data and maintaining the accumulated data in an EEPROM device that is more reliable and robust against errors caused by fading and interface-based disturbances.

BRIEF DESCRIPTION OF THE DRAWINGS

FIG. 5 is a flow chart illustrating a method of writing the updated count to the second memory device.

DETAILED DESCRIPTION OF A PREFERRED EMBODIMENT

Figure 1:
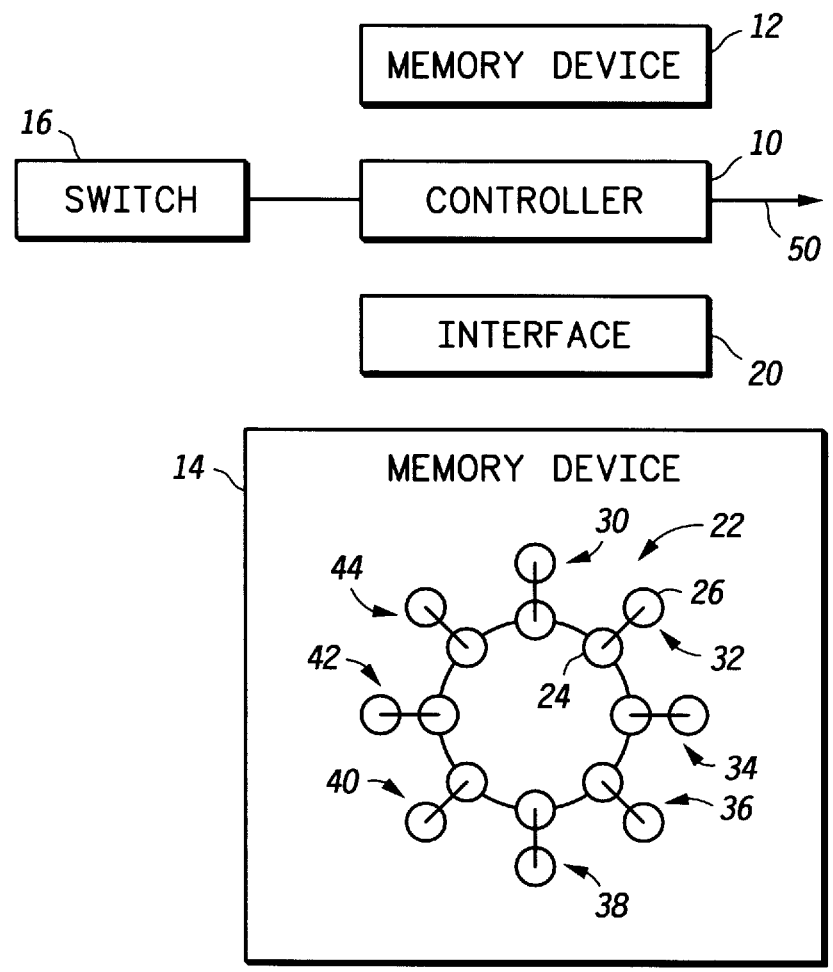
FIG. 1 is a block diagram of an embodiment of a system for accumulating data and maintaining the accumulated data.

FIG. 1 is a block diagram of an embodiment of a system for accumulating data and maintaining the accumulated data. The system includes a controller 10, a first memory device 12, and a second memory device 14 which cooperate to accumulated data and maintain the accumulated data. The accumulated data can indicate a number of events that occur or are detected over a lifetime of a product. In one application of particular interest, each event includes detecting an actuation of a switch 16. In this application, the system counts and stores a maximum of 3,000,000 switch actuations over a period of ten years. It is noted, however, that the system can be used in a variety of applications where a quantity of events are to be recorded.

The controller 10 cooperates with the first memory device 12 to maintain an intermediate count of events. The intermediate count of events is maintained by accumulating incremental event counts. In other words, the intermediate count is incremented or decremented in response to occurrence of each event. For example, the intermediate count can be incremented or decremented in response to each actuation of the switch 16.

The controller 10 cooperates with the second memory device 14 to maintain a total event count non-inclusive of the intermediate count. The controller 10 updates the total event count in the second memory device 14 based upon the intermediate count. For example, the intermediate count can be added to the event count in the second memory device 14 once the intermediate count attains or exceeds a predetermined threshold of counts. Once the event count in the second memory device 14 is updated, the intermediate count in the first memory device 12 is cleared-out, or reset.

In this way, the first memory device 12 provides a relatively short-term storage of a number of events which occur between updates of the second memory device 14, and the second memory device 14 provides long-term accumulated data storage. To store long-term data, the second memory device 14 preferably includes a non-volatile memory such as a serial EEPROM. The controller 10 and the second memory device 14 communicate via an interface 20 such as a Serial Peripheral Interface (SPI). To store short-term data requiring a greater number of write cycles, the first memory device 12 preferably comprises a volatile memory such as a Random Access Memory (RAM).

The second memory device 14 provides a plurality of memory locations 22 to store a plurality of (event) count values. Each of the memory locations 22 has a first part 24 to store a first count portion and a second part 26 to store a second count portion. In the preferred embodiment, the first part 24 includes four bytes of memory and the second part 26 includes one byte of memory (with eight bits per byte). Further, each of the memory locations 22 is used to store an error detection code.

The first count portion is representative of a number of counts scaled by a scaling factor. Hence, a single count in the first count portion represents the scaling factor of counts in the second count portion. It is preferred that the scaling factor be equal to the predetermined threshold to which the intermediate count is compared for initiating an update. Although configurable, a default value of the scaling factor is set to 13.

Preferably, the first count portion represents an integral division of the number of counts by the scaling factor. The second count portion is representative of a remainder number of counts after performing the aforementioned integral division. In general, the second count portion can represent either zero or a non-zero quantity.

The error detection code is used to detect whether the first count portion and the second count portion are valid.

Preferably, the error detection code includes a 16-bit cyclic redundancy code (CRC). Of course, other error detection schemes may be used as well.

The plurality of memory locations 22 are defined as contiguous locations arranged in a ring architecture. The ring architecture provides a history of the total event count. The history is beneficial in protecting the system from corruption of the accumulated data. A detailed description of how the plurality of memory locations 22 are accessed is detailed in FIG. 2.

In a preferred embodiment, the plurality of memory locations 22 includes eight memory locations 30, 32, 34, 36, 38, 40, 42, and 44. Using eight memory locations with an appropriate scaling factor can provide a worst-case number of write cycles less than 100,000 for each memory location in the aforementioned application of particular interest. It is noted, however, that the scope of the present invention is inclusive of any number of memory locations.

The controller 10 includes an output 50 for periodically sending a signal having a message containing a field for an error flag. The error flag indicates whether the accumulated data is valid or invalid. The error flag assists in preventing incorrect or corrupted data from being interpreted as valid.

In the preferred embodiment, the controller 10 and the first memory device 12 are included in a 68HC05 controller manufactured by Motorola, Inc. The second memory device 14 preferably includes a 93CS66 EEPROM manufactured by National Semiconductor.

Figure 2:
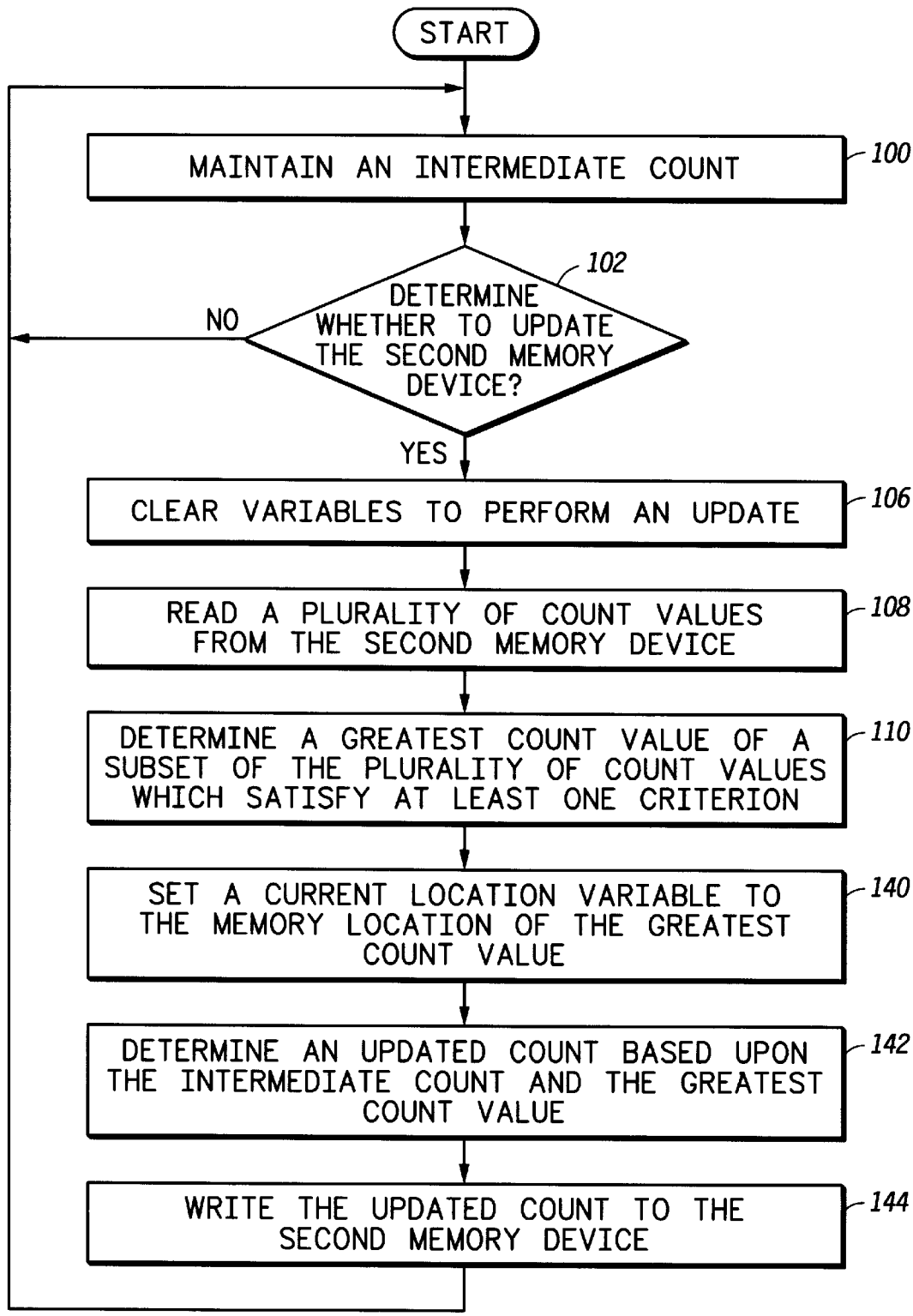
FIG. 2 is a flow chart showing a method of accumulating data and maintaining the accumulated data.

FIG. 2 is a flow chart showing a method of accumulating data and maintaining the accumulated data. The method can be directed by the controller 10 or a like controller using the system described with reference to FIG. 1. It is noted, however, that the method can also be performed using alternative systems having a controller such as a microprocessor, an application specific integrated circuit, or the like.

As shown in step 100, the method includes maintaining an intermediate count in the first memory device 12. The step of maintaining the intermediate count includes repeatedly incrementing or decrementing a variable located in the first memory device 12 responsive to each of a plurality of events. In this way, the variable indicates a number of events which have occurred between updates of the second memory device 14.

It is preferred that the variable in the first memory device 12 be protected by a code such as an error correction code or an error detection code. The code can be stored with the variable in the first memory device 12. In the preferred embodiment, the code includes a 16-bit cyclic redundancy code (CRC).

As shown in step 102, the method includes determining whether or not to update the second memory device 14. This step preferably includes monitoring the first memory device 12 to determine if the intermediate count has attained or exceeded a predetermined threshold. If the intermediate count has attained or exceeded the predetermined threshold, an update of the second memory device 14 is initiated. Additionally, this step can include determining that a regularly-scheduled update is to be performed. For example, a daily update may be initiated for updating the second memory device 14. The period between regularly-scheduled updates can be selected in dependence upon a required count accuracy. As another option, an update of the second memory device 14 can be scheduled prior to a predetermined activity, such as a high current activity on a battery-powered system.

The predetermined threshold is based upon, and is preferably equal to, the scaling factor. The scaling factor is used to scale down the number of total counts and reduce the number of bits required for maximum accumulation in the second memory device 14. Preferably, the variable in the first memory device 12 is capable of storing an intermediate count greater than the scaling factor. More preferably, the variable in the first memory device 12 is capable of storing an intermediate count up to twice the scaling factor.

The scaling factor is selected based upon the accuracy requirements of the application, the memory availability in the first memory device 12, and the memory availability in the second memory device 14. As such, the scaling factor can vary from system to system. The scaling factor can be stored with protection, such as an error correction code or an error detection code, as configuration information in the second memory device.

If it is determined that no update is to be performed, flow of the method is directed to back to step 100 to continue maintaining the intermediate count. If it is determined that an update is to be performed, flow of the method is directed to step 106.

In step 106 the method clears or otherwise resets a plurality of variables used to perform the update. The variables can include a plurality of marking variables for marking each of the memory locations 22 of the second memory device 14. Preferably, the plurality of marking variables are included in a single one-byte variable (herein referred to as MARKOUT). In this case, each bit of the MARKOUT variable is associated with a corresponding memory location. Each bit is used to indicate whether a count value stored by its associated memory location is valid. By resetting the MARKOUT variable (e.g. by setting each bit to zero), each count value is initially considered as being valid.

The variables can also include a variable indicating a total number of marked memory locations (herein referred to as TOTAL MARKOUTS). By resetting the TOTAL MARKOUTS variable to zero, none of the count values is initially considered to be invalid.

The variables can also include a variable indicating a number of write attempts made to the second memory device 14. This variable is also initialized to zero.

As shown in step 108, a plurality of count values is read from the plurality of memory locations 22 of the second memory device 14. Each count value includes a first count portion, a second count portion, and an associated code as described with reference to FIG. 1.

As shown in step 110, the method includes determining a greatest count value of a subset of the plurality of count values which satisfy at least one criterion. The subset of the plurality of count values include only valid count values as defined by the at least one criterion. Preferably, the at least one criterion includes a first criterion that each count value of the subset satisfies an error check based upon its associated code, and a second criterion that the greatest count value differs from a second greatest count value from the subset by at most a predetermined difference greater than one. Using these criteria, the memory location having the highest valid number of total counts is determined.

Figure 3:
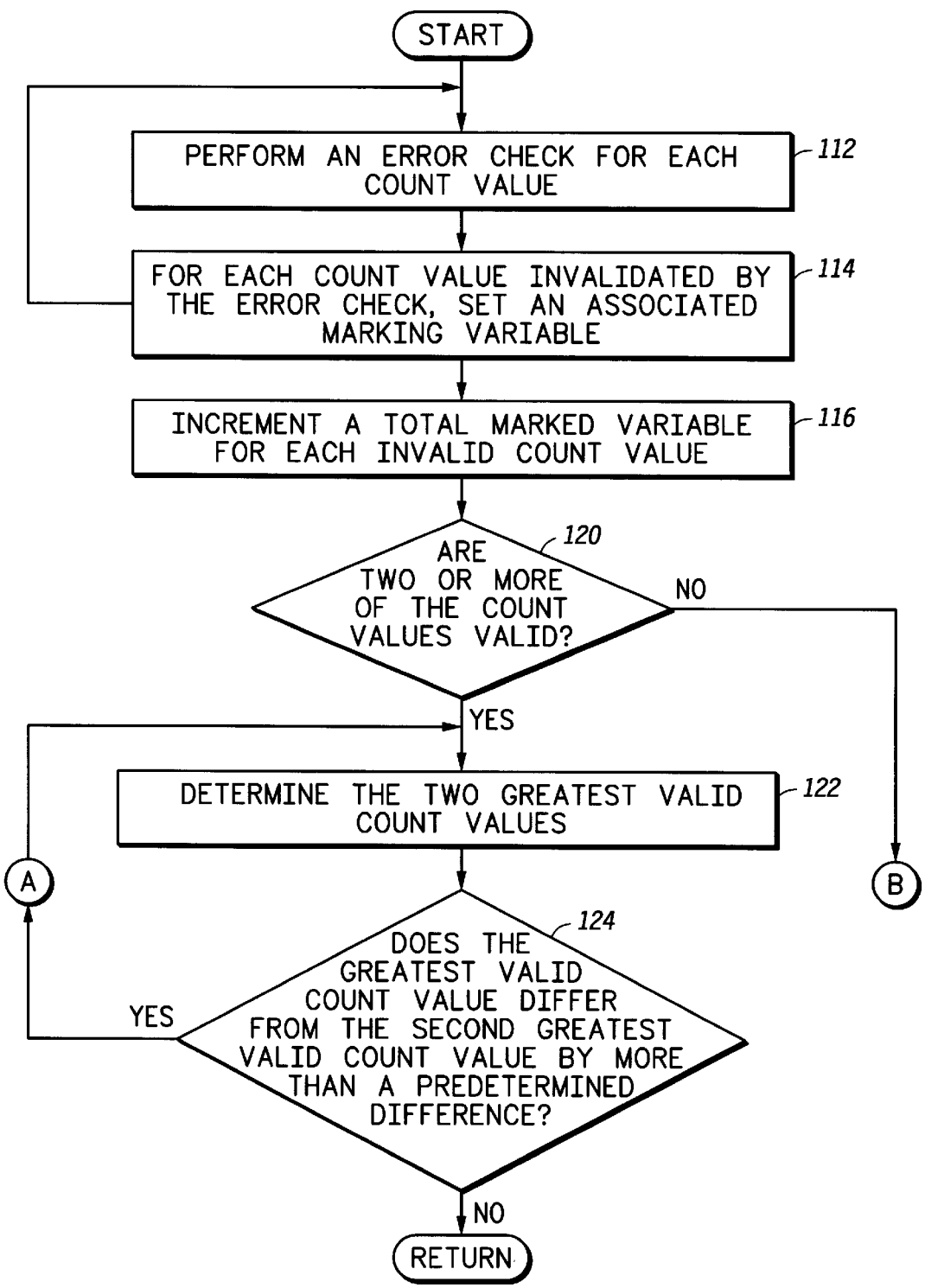
FIG. 3 is a flow chart illustrating a method of determining the greatest valid count value.

FIG. 3 is a flow chart illustrating a method of determining the greatest valid count value. An error check is performed for each count value using its the associated code (step 112). Preferably, the error check includes performing an error detection step using the 16-bit CRC associated with the count value. If a count value is determined to be invalid based upon the error check, then its associated marking variable is set accordingly (step 114). In this case, for example, an associated bit in the MARKED variable can be set to a logical "one". In addition, the TOTAL MARKED variable is incremented (step 116).

Figure 4:
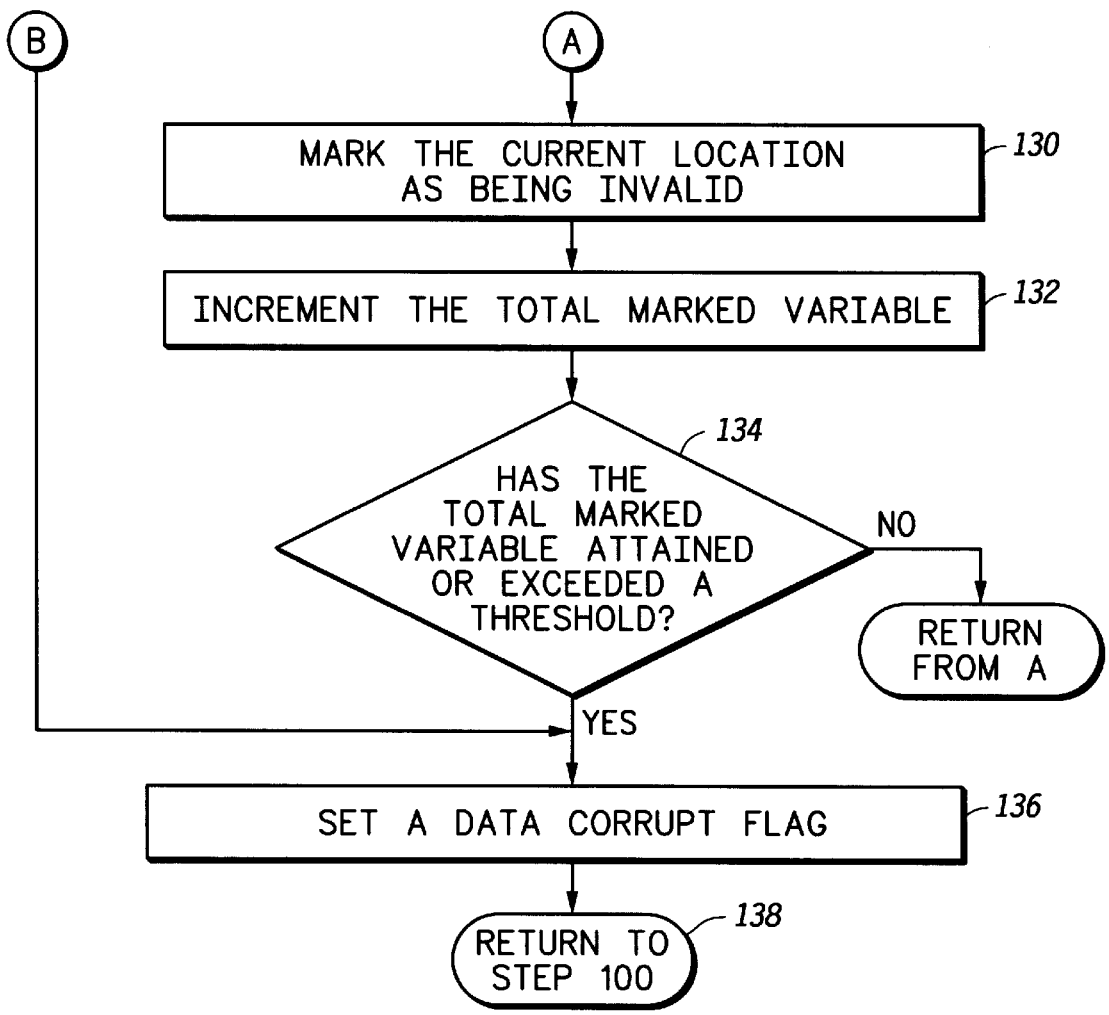
FIG. 4 is a flow chart showing a method of handling an invalid count value.

If only one or less of the count values is valid after performing the error check (step 120), then the update is aborted. Otherwise, a step of determining the two greatest valid count values is performed (step 122). If the greatest count value differs from the second greatest count value by more than the predetermined difference (step 124), then steps described with reference to FIG. 4 are performed. It is noted that in the preferred embodiment, the predetermined difference is three counts in the first count portion.

FIG. 4 is a flow chart showing a method of handling an invalid count value. As shown in step 130, the method includes marking the current location as being invalid. If invoked from step 124 in FIG. 3, the greatest count value is marked as being invalid. As shown in step 132, a step of incrementing the TOTAL MARKED variable is performed.

If the TOTAL MARKED variable attains or exceeds a predetermined threshold (step 134), then a step of setting a data corrupt flag is performed (step 136). Thereafter, flow of the method is directed back to step 100.

If the TOTAL MARKED variable has not attained or exceeded the predetermined threshold, flow of the method returns to the point at which it was invoked (as indicated by return step 138). For example, if invoked from step 124 in FIG. 3, flow of the method returns to step 122. In this case, a new, two greatest count values of the subset are determined with the previously-determined greatest value being omitted from the subset. Preferably, the predetermined threshold used in step 134 is five.

Referring back to FIG. 2, a step of setting a current location variable to the memory location associated with the greatest count value is performed (step 140) once the greatest count value differs from the second greatest count value by at most the predetermined difference in step 124. Although the greatest count value is the greatest in the subset, it is noted that the full set of count values may include a count value greater than the greatest count value (as a result of the second criterion).

The first criterion based upon the error check advantageously detects many corrupted memory locations. It is possible, however, that a fault in communication between the controller 10 and the second memory device 14 (e.g. a random write induced by an external RF field) can cause a count value and a CRC to be written that serendipitously passes the error check. The second criterion assists in invalidating these count values.

Step 142 indicates a step of determining an updated count based upon the intermediate count and the greatest count value. A pseudo-code representation of this step is indicated in TABLE I.

TABLE I interim counts=intermediate count+remainder counts
if (interim counts<scaling factor) then
updated scaled counts=scaled counts {no change}
updated remainder counts=interim counts
updated intermediate count=0
else if (interim counts=scaling factor) then
updated scaled counts=scaled counts+1
updated remainder counts=0
updated intermediate count=0
else if (interim counts>scaling factor) then
updated scaled counts=scaled counts+1
updated interim counts=interim counts−scaling factor
if (updated interim counts>=scaling factor) then
updated intermediate count=updated interim counts
updated remainder counts=0
else updated remainder counts=updated interim counts In the TABLE I representation, the variable "interim counts" denotes an interim count, the variable "intermediate counts" denotes the intermediate count, the variable "scaled counts" denotes the first count portion of the greatest count value, the variable "remainder counts" indicates the second count portion of the greatest count value, the variable "scaling factor" denotes the scaling factor, the variable "updated scaled counts" denotes the first count portion of the updated count, the variable "updated remainder counts" denotes the second count portion of the updated count, the variable "updated interim counts" indicates an updated interim count, and the variable "updated intermediate counts" is used when resetting the intermediate count.

A sum of the intermediate count and the second count portion of the greatest count value is determined to form the interim count. If the interim count is less than the scaling factor, then the updated count includes a first updated count portion equal to the first count portion and a second updated count equal to a sum of the intermediate count and the second count portion. If the interim count is equal to the scaling factor, then the updated count includes a first updated count portion equal to the first count portion plus one, and a second updated count portion equal to zero.

If the interim count is greater than or equal to the scaling factor, then the updated count includes a first updated count portion equal to the first count portion plus one. If a difference between the interim count and the scaling factor is greater than the scaling factor (i.e. if the interim count is greater than twice the scaling factor), then the second updated count portion is set to zero, and the intermediate count is reset to the aforementioned difference. In this case, the intermediate count is at least equal to the scaling factor, which causes a subsequent update to be initiated in step 102. If the difference is less than the scaling factor, the second updated count portion is set equal to the intermediate count plus the second count portion minus the scaling factor.

After determining the updated count, the updated count is written to the second memory device 14 as shown in step 144. A preferred process for writing the updated count to the second memory device 14 is described with reference to FIG. 5.

FIG. 5 is a flow chart illustrating a method of writing the updated count to the second memory device 14. Step 150 indicates a step of determining if the number of write attempts has attained or exceeded a threshold, such as five. If so, flow of the method is directed to step 136 in FIG. 4 wherein the data corrupt flag is set. Thereafter, flow of the method is directed back to step 100.

If the number of write attempts is less than the threshold, then a step of incrementing the current location variable is performed (step 152). In accordance with the ring configuration, incrementing from the eighth location results in the current location variable indicating the first location. Alternatively, a step of decrementing the current location variable can be performed. In this case, decrementing from the first location results in the current location variable indicating the eighth location.

As shown in step 154, a step of comparing the TOTAL MARKED variable to a threshold such as four is performed. If the TOTAL MARKED variable is greater than or equal to the threshold, flow of the method is directed to step 156 to perform a step of determining if the current location variable indicates a marked count value. If the current location variable indicates an unmarked location, then flow of the method returns to step 152 to further increment the current location variable.

If the TOTAL MARKED variable is less than the threshold, or if the current location variable indicates a marked location, then a step of attempting to write the updated count to the current location is performed (step 160). The attempt to write the updated count is verified (step 162) by reading the data stored by the current location, and comparing the data to the updated count. Alternatively, the data can be verified by performing a CRC check If the data differs from the updated count, then flow of the method is directed to step 130 in FIG. 4 so that the current location can be marked. If the data is equal to the updated count, then the write attempt is deemed successful.

If the write attempt is the first successful write attempt (step 166), then a step of resetting the intermediate count is performed (step 170). The intermediate count is reset either to zero or to a non-zero count according to TABLE I. Thereafter, flow of the method is directed back to step 152 to increment the current location variable.

If the write attempt is the second successful write attempt (step 172), then the step of writing the updated count to the second memory device 14 is completed. In this case, the updated count is written to two memory locations of the second memory device 14. Thereafter, a step of clearing or resetting the data corrupt flag is performed (step 174).

The aforementioned steps involved in writing the updated count can be summarized as follows. Write attempts continue until either two successful writes are performed or a maximum of five write attempts are performed.

The completion of two successful writes results in the updated count being written over two of the plurality of count values stored by the second memory device 14. In this case, steps of writing the updated count to a first memory location of the second memory device, resetting the intermediate count upon verifying that the updated count is stored by the first memory location, and writing the updated count to a second memory location of the second memory device after resetting the intermediate count, are performed. Preferably, the first memory location and the second memory location differ from a memory location at which the greatest count value determined in step 110 is stored. It is noted that after resetting the intermediate count, but prior to writing the updated count to the second memory location, one or more unsuccessful write attempts may be performed. Each unsuccessful attempt includes steps of attempting to write the updated count to a memory location of the second memory device, reading data stored by the memory location, and determining that the data differs from the updated count.

In contrast, a step of setting the data corrupt flag is performed upon attempting to write the updated count a maximum number of times (in this case, five times). In general, the maximum number of times is selected to be less than a number of the plurality of count values stored by the second memory device 14. After setting the flag, the intermediate count is continued to be maintained without resetting the intermediate count.

A maximum of four memory locations can be marked before setting the data corrupt flag. Hence, in a worst-case write attempt subject to interference, a maximum of four memory locations are written unsuccessfully and contain corrupt data. The fifth and final write attempt only occurs at a memory location which is currently marked. Thereafter, the update is aborted. In this way, the fifth write attempt does not cause further corruption of the accumulated data since the memory location is already considered corrupt. In general, the step of writing the updated count can comprise steps of unsuccessfully attempting to write the updated count to at least two of a plurality of memory locations of the second memory device 14 including a first memory location, and re-attempting to write the updated count to the first memory location thereafter.

The steps involved in writing the updated count also provide a recovery method which prevents data loss during a temporary period of interference between the controller 10 and the second memory device 14. The recovery method relies on valid access of the first memory device 12 during the temporary period of interference. If the second memory device 14 cannot be accessed either when finding the current memory location or when writing the updated count, the intermediate count kept in the first memory device 12 is allowed to overflow beyond the scaling factor. Further, the intermediate count in the first memory device 12 is not cleared until one successful write of the updated count to the second memory device 14 has occurred. Still further, even if data written to the second memory device 14 is corrupted by interference, at least four memory locations contain valid data, including the two locations with the greatest count values. Even further, update attempts continually occur until the counts stored in the first memory device 12 reach twice the scaling factor.

The steps in the method described with reference to FIG. 2 are repeated for each subsequent update. It is noted that the step indicated by step 110 can be used to find the current ring location each time a total accumulation of events is to be determined in an application. The total accumulation of events that have occurred at a point in time is equal to the sum of the intermediate count from the first memory device 12 and the greatest count value from the second memory device 14. In the preferred embodiment, the total accumulation of events is the sum of: the intermediate count, the second count portion of the greatest count value, and the product of the scaling factor and the first count portion of the greatest count value.

It is also noted that a device comprised of a computer-readable or machine-readable storage medium having computer-readable or machine-readable data can be used to direct the controller 10 to perform the herein-described methods. For example, the device can include a magnetic storage medium having magnetic data, an electronic storage medium having electronic data, or an optical storage medium having optical data, in communication with the controller 10.

The described embodiments of the present invention advantageously provide a reliable means to accumulate and store data in a nonvolatile memory device, such as an EEPROM. Embodiments of the present invention address both the long-term failure modes of EEPROM technology including fading, and the short-term failure modes of an interface between a controller and the EEPROM.

By maintaining an intermediate count in another memory device and updating the EEPROM when the intermediate count exceeds a threshold, a resulting number of write cycles to the EEPROM is reduced. Wear of individual memory locations in the EEPROM is equalized by spreading the data using the ring storage approach.

By writing an updated count to two memory locations in the EEPROM, a valid updated count is maintained if one of the two memory locations experiences a fading wear-out. Additionally, the valid one of the two memory locations can be determined without using flags in the EEPROM or the RAM, which also may be subject to corruption.

By allowing overflow of the intermediate count in the first memory device 12 up to twice the scaling factor, counts can continue to be accumulated by the intermediate count while attempting to update the second memory device 14. This is of importance in cases where interference temporarily prevents the update of the second memory device 14.

Temporary interference is also addressed by verifying a memory location after a count value has be written thereto. If the data in the memory location is invalid, the count value is rewritten. Further, the intermediate count is not reset until a successful write has been verified.

By retrying memory locations deemed invalid in previous updates, premature system failure due to data corruption from temporary interference is avoided.

By including a historical check to determine if a count value is valid, protection is provided against a completely random corruption where the data and the CRC match.

In extreme failure cases, a flag is set so that incorrect data is not reported.

What is claimed is:

1. A method of accumulating data and maintaining the accumulated data comprising the steps of:
   (a) maintaining an intermediate count in a first memory device;
   (b) reading a plurality of count values from a second memory device;
   (c) determining a greatest count value of a subset of the plurality of count values which satisfy at least one criterion, the at least one criterion including a criterion that the greatest count value differs from a second greatest count value of the subset of the plurality of count values by at most a predetermined difference greater than one; and
   (d) determining an updated count based upon the intermediate count and the greatest count value.

2. The method of claim 1 wherein the plurality of count values include a count value greater than the greatest count value.

3. The method of claim 1 wherein the at least one criterion includes a criterion that each count value of the subset of the plurality of count values satisfies an error check.

4. The method of claim 3 wherein each error check is based upon an associated error detection code stored by the second memory device.

5. The method of claim 1 wherein the greatest count value includes a first count portion and a non-zero second count portion, wherein the updated count includes a first updated count portion equal to the first count portion and a second updated count equal to a sum of the intermediate count and the non-zero second count portion.

6. The method of claim 1 wherein the greatest count value includes a first count portion and a non-zero second count portion, wherein a single count in the first count portion represents a scaling factor of counts in the non-zero second count portion.

7. The method of claim 6 wherein the intermediate count is greater than the scaling factor.

8. The method of claim 6 wherein the updated count includes a first updated count portion and a second updated count portion, wherein the first updated count portion is equal to the first count portion plus one, and wherein the second updated count portion is equal to the intermediate count plus the non-zero second count portion minus the scaling factor.

9. The method of claim 1 further comprising the steps of:
   (e) writing the updated count to the second memory device; and
   (f) repeating steps (a) to (e).

10. The method of claim 1 wherein the second memory device includes a nonvolatile memory.

11. The method of claim 10 wherein the first memory device includes a volatile memory.

12. A method of accumulating data and maintaining the accumulated data comprising the steps of:
   maintaining an intermediate count in a first memory device;
   providing a second memory device having a plurality of memory locations including a first memory location and a second memory location, the plurality of memory locations storing a plurality of count values;
   determining an updated count based upon the intermediate count and at least one of the plurality of count values;
   writing the updated count to the first memory location of the second memory device;
   resetting the intermediate count upon verifying that the updated count is stored by the second memory device; and
   writing the updated count to the second memory location of the second memory device after resetting the intermediate count.

13. The method of claim 12 wherein resetting the intermediate count comprises resetting the intermediate count to zero.

14. The method of claim 12 wherein resetting the intermediate count comprises resetting the intermediate count to a non-zero count.

15. The method of claim 12 wherein the updated count is determined based upon a count value stored at a third memory location of the plurality of memory locations.

16. The method of claim 12 further comprising the steps of, prior to writing the updated count to the second memory location but after resetting the intermediate count:
   attempting to write the updated count to a third memory location of the second memory device;
   reading data stored by the third memory location; and
   determining that the data differs from the updated count.

17. The method of claim 12 wherein the step of writing the updated count to the second memory location comprises:
   attempting to write the updated count to the second memory location; and
   verifying that the updated count is stored by the second memory location.

18. The method of claim 12 wherein the second memory device includes a nonvolatile memory.

19. The method of claim 12 wherein the first memory device includes a volatile memory.

20. A method of accumulating data and maintaining the accumulated data comprising the steps of:
   maintaining an intermediate count in a first memory device;
   providing a second memory device having a plurality of memory locations including a first memory location and a second memory location, the plurality of memory locations storing a plurality of count values;
   determining an updated count based upon the intermediate count and at least one of the plurality of count values;
   attempting to write the updated count to at least two of the plurality of memory locations of the second memory device including a first memory location; and re-attempting to write the updated count to the first memory location.

21. The method of claim 20 further comprising the step of setting a flag upon an unsuccessful attempt to write the updated count a predetermined number of times to the second memory device.

22. The method of claim 21 wherein the predetermined number of times is less than a number of the plurality of count values.

23. The method of claim 21 further comprising the step of continuing to maintain the intermediate count, without resetting the intermediate count, after setting the flag.

24. The method of claim 20 wherein the second memory device includes a nonvolatile memory.

25. The method of claim 24 wherein the first memory device includes a volatile memory.

26. A method of accumulating data and maintaining the accumulated data comprising the steps of:

maintaining an intermediate count in a first memory device;

providing a second memory device having a plurality of memory locations including a first memory location and a second memory location, the plurality of memory locations storing a plurality of count values;

determining a greatest count value of a subset of the plurality of count values which satisfy a first criterion and a second criterion, wherein the first criterion is that each count value of the subset of the plurality of count values satisfies an error check based upon an associated error detection code stored by the second memory device, and wherein the second criterion is that the greatest count value differs from a second greatest count value of the subset of the plurality of count values by at most a predetermined difference;

determining an updated count based upon the intermediate count and the greatest count value;

writing the updated count to the first memory location of the second memory device;

resetting the intermediate count upon verifying that the updated count is stored by the second memory device; and writing the updated count to the second memory location of the second memory device after resetting the intermediate count.

27. A system for accumulating data and maintaining the accumulated data, the system comprising:

a controller to cooperate with a first memory device to maintain an intermediate count and to cooperate with a second memory device to read a plurality of count values therefrom, the controller operative to determine a greatest count value of a subset of the plurality of count values which satisfy at least one criterion, and to determine an updated count based upon the intermediate count and the greatest count value, wherein the at least one criterion includes a criterion that the greatest count value differs from a second greatest count value of the subset of the plurality of count values by at most a predetermined difference greater than one.

28. The system of claim 27 wherein the second memory device comprises a nonvolatile memory.

29. The system of claim 28 wherein the second memory device comprises an EEPROM.

30. A device comprising:

a machine-readable storage medium; and machine-readable data stored by the machine-readable storage medium, the machine-readable data to direct a controller to maintain an intermediate count in a first memory device, to read a plurality of count values from a second memory device, to determine a greatest count value of a subset of the plurality of count values which satisfy at least one criterion, and to determine an updated count based upon the intermediate count and the greatest count value, wherein the at least one criterion includes a criterion that the greatest count value differs from a second greatest count value of the subset of the plurality of count values by at most a predetermined difference greater than one.

* * * * *